(12) United States Patent
Chou et al.

(10) Patent No.: US 11,442,508 B2
(45) Date of Patent: Sep. 13, 2022

(54) EXPANSION ELECTRONIC DEVICE AND ELECTRONIC SYSTEM

(71) Applicant: GETAC TECHNOLOGY CORPORATION, Hsinchu County (TW)

(72) Inventors: Hsin-Chih Chou, Taipei (TW); Juei-Chi Chang, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 17/028,961

(22) Filed: Sep. 22, 2020

(65) Prior Publication Data

US 2021/0092858 A1 Mar. 25, 2021

Related U.S. Application Data

(60) Provisional application No. 62/904,967, filed on Sep. 24, 2019.

(51) Int. Cl.
*G06F 1/16* (2006.01)
*H01Q 1/22* (2006.01)
(Continued)

(52) U.S. Cl.
CPC .............. *G06F 1/1656* (2013.01); *E05D 3/02* (2013.01); *E05D 5/04* (2013.01); *F16C 11/04* (2013.01); *G06F 1/1654* (2013.01); *G06F 1/1679* (2013.01); *G06F 1/1683* (2013.01); *G06F 1/1698* (2013.01); *H01Q 1/2266* (2013.01); *H05K 5/0017* (2013.01); *H05K 5/0204* (2013.01); *H05K 5/04* (2013.01);
(Continued)

(58) Field of Classification Search
CPC .. G06F 1/1656; H05K 5/0017; H05K 5/0204; H05K 5/04; H05K 5/061; H05K 5/069
See application file for complete search history.

(56) References Cited

U.S. PATENT DOCUMENTS 4,969,830 A * 11/1990 Daly ..................... G06F 1/1632
200/50.1
5,132,876 A * 7/1992 Ma ....................... G06F 1/1616
361/679.09
(Continued)

*Primary Examiner* — Abhishek M Rathod
*Assistant Examiner* — Keith DePew

(57) ABSTRACT

The present invention discloses an expansion electronic system and an electronic system. The expansion electronic device is adapted to be joined with a primary electronic device into one integral and to operate cooperatively. The expansion electronic device includes a housing and a plurality of functional modules. The housing has an assembly surface on a top side thereof and a plurality of individually independent receiving chambers on a bottom side thereof. The assembly surface is configured to join with the primary electronic device, and a first waterproof space is formed by means of structural interference between the assembly surface and the primary electronic device. The plurality of functional modules are disposed in the plurality of receiving chambers, respectively, and are individually installed or removed. A second waterproof space is formed by means of structural interference between one of the receiving chambers and the corresponding functional module.

4 Claims, 11 Drawing Sheets

(51) Int. Cl.
  *H05K 5/02*    (2006.01)
  *H05K 5/06*    (2006.01)
  *H05K 5/00*    (2006.01)
  *H05K 5/04*    (2006.01)
  *E05D 3/02*    (2006.01)
  *E05D 5/04*    (2006.01)
  *F16C 11/04*   (2006.01)

(52) U.S. Cl.
  CPC ............ *H05K 5/061* (2013.01); *H05K 5/069* (2013.01); *E05Y 2900/606* (2013.01); *G06F 1/1616* (2013.01)

(56) References Cited

U.S. PATENT DOCUMENTS

| | | | | |
|---|---|---|---|---|
| 5,278,730 A * | 1/1994 | Kikinis | ................ | G06F 1/1626 361/679.32 |
| 5,329,427 A * | 7/1994 | Hogdahl | ................ | G06F 1/16 361/728 |
| 5,430,617 A * | 7/1995 | Hsu | ................ | G06F 1/1616 361/679.4 |
| 5,627,728 A * | 5/1997 | Ma | ................ | G06F 1/1632 361/679.41 |
| 5,786,984 A * | 7/1998 | Bonardi | ................ | G06F 1/1601 361/679.33 |
| 5,847,924 A * | 12/1998 | Youn | ................ | G06F 1/1632 361/679.43 |
| 5,850,209 A * | 12/1998 | Lemke | ................ | G06F 1/1601 345/156 |
| 6,099,355 A * | 8/2000 | Johnson | ................ | G06F 1/1616 439/271 |
| 6,108,199 A * | 8/2000 | Bonardi | ................ | G06F 1/1601 361/679.37 |
| 6,244,903 B1 * | 6/2001 | Johnson | ................ | G06F 1/1616 439/271 |
| 7,236,356 B2 * | 6/2007 | Ulla | ................ | G06F 1/1626 361/679.21 |
| 7,400,496 B2 * | 7/2008 | Sauer | ................ | G06F 1/1626 345/169 |
| 8,373,980 B2 * | 2/2013 | Reber | ................ | G06F 1/1632 361/679.3 |
| 8,699,216 B2 * | 4/2014 | Reber | ................ | G06F 1/182 361/679.26 |
| 8,699,220 B2 * | 4/2014 | Reber | ................ | G06F 1/1632 361/679.4 |
| 9,405,333 B1 * | 8/2016 | Pine | ................ | G06F 1/1656 |
| 9,529,392 B2 * | 12/2016 | Lee | ................ | G06F 1/1656 |
| 9,772,658 B1 * | 9/2017 | Hsu | ................ | B29C 45/1615 |
| 10,482,927 B2 * | 11/2019 | Huang | ................ | G11B 33/02 |
| 10,609,461 B1 * | 3/2020 | Lo | ................ | H04R 1/44 |
| 2002/0085343 A1 * | 7/2002 | Wu | ................ | G06F 1/1616 361/679.55 |
| 2004/0055186 A1 * | 3/2004 | Bolduan | ................ | D06F 58/203 38/144 |
| 2006/0023406 A1 * | 2/2006 | Shih | ................ | G06F 1/1656 361/679.55 |
| 2008/0030955 A1 * | 2/2008 | Chen | ................ | G06F 1/203 361/700 |
| 2010/0169561 A1 * | 7/2010 | Harari | ................ | G06K 19/07741 711/103 |
| 2012/0043331 A1 * | 2/2012 | Nameki | ................ | H04M 1/0202 220/378 |
| 2012/0099262 A1 * | 4/2012 | Reber | ................ | G06F 1/1626 361/679.4 |
| 2012/0099265 A1 * | 4/2012 | Reber | ................ | G06F 1/1626 361/679.26 |
| 2012/0099266 A1 * | 4/2012 | Reber | ................ | G06F 1/1626 361/679.26 |
| 2012/0170203 A1 * | 7/2012 | Oberpriller | ................ | G06F 1/1656 361/679.41 |
| 2014/0368994 A1 * | 12/2014 | Lee | ................ | H05K 5/061 361/679.55 |
| 2014/0370739 A1 * | 12/2014 | Lee | ................ | H01M 50/209 439/366 |
| 2019/0244640 A1 * | 8/2019 | Huang | ................ | G11B 25/043 |
| 2021/0092858 A1 * | 3/2021 | Chou | ................ | H01Q 21/08 |

* cited by examiner

EXPANSION ELECTRONIC DEVICE AND ELECTRONIC SYSTEM

CROSS-REFERENCE TO RELATED APPLICATIONS

The present application claims the benefit of U.S. provisional Patent Application No. 62/904,967, filed on Sep. 24, 2019, the disclosure of which is hereby incorporated by reference herein in its entirety.

BACKGROUND OF THE INVENTION

Field of the Invention

The present invention relates to the technical field of laptop computers, and more particularly to an expansion electronic device and an electronic system.

Description of the Prior Art

Accompanied by rapid technology development, computers are thoroughly infiltrated into daily lives of the general public, such that computers are omni-present and have become indispensable necessities of the modern life. Laptop computers feature advantages of being small in volume, light in weight and readily portable compared to desktop computers, and so sale volumes of laptop computers continue to gradually rise year to year.

However, also because structures of current laptop computers are designed towards goals of being small in volume, light in weight and readily portable, functionality of original laptop computers is compromised. In addition, current laptop computers lack designs for waterproofness.

Therefore, it is a critical task of the industry as how to strengthen functionality and waterproofness of laptop computers by structural improvement so as to overcome the described drawbacks.

SUMMARY OF THE INVENTION

The technical problem to be solved by the present invention is to provide an expansion electronic device and an electronic system for drawbacks of the prior art.

To solve the above technical problem, an expansion electronic device is provided according to a technical solution of the present invention. The expansion electronic device is adapted to be joined with a primary device into an integral and to operate cooperatively. The expansion electronic device includes a housing and a plurality of functional modules. The housing has an assembly surface on a top side thereof and a plurality of individually independent receiving chambers on a bottom side thereof. The assembly surface is configured to join with the primary electronic device, and a first waterproof space is formed by means of structural interference between the assembly surface and the primary electronic device. The plurality of functional modules are disposed in the plurality of receiving chambers, respectively, and are individually installed or removed. A second waterproof space is formed by means of structural interference between one of the receiving chambers and the corresponding functional module.

To solve the above technical problem, an electronic system is further provided according to another technical solution of the present invention. The electronic system includes a primary electronic device and the described expansion electronic device, and the expansion electronic device and the primary device are joined into an integral and operate cooperatively.

One beneficial effect of the present invention is that, the expansion electronic device and the electronic system provided by the present invention are capable of enhancing functionality of the primary electronic device as well as improving waterproofness and dustproofness by the technical solution that is "the expansion electronic device includes a housing and a plurality of functional modules, the housing has an assembly surface on a top side thereof and a plurality of individually independent receiving chambers on a bottom side thereof, the assembly surface is configured to join with the primary electronic device, a first waterproof space is formed by means of structural interference between the assembly surface and the primary electronic device, the plurality of functional modules are disposed in the plurality of receiving chambers, respectively, and are installed or removed individually, and a second waterproof space is formed by means of structural interference between one of the receiving chambers and the corresponding functional module".

To better understand the features and technical contents of the present invention, detailed description and drawings related to the present invention are given below. However, the provided drawings are for reference and illustration purposes, and are not to be construed as limitations to the present invention.

DETAILED DESCRIPTION OF THE EMBODIMENTS

Figure 1:
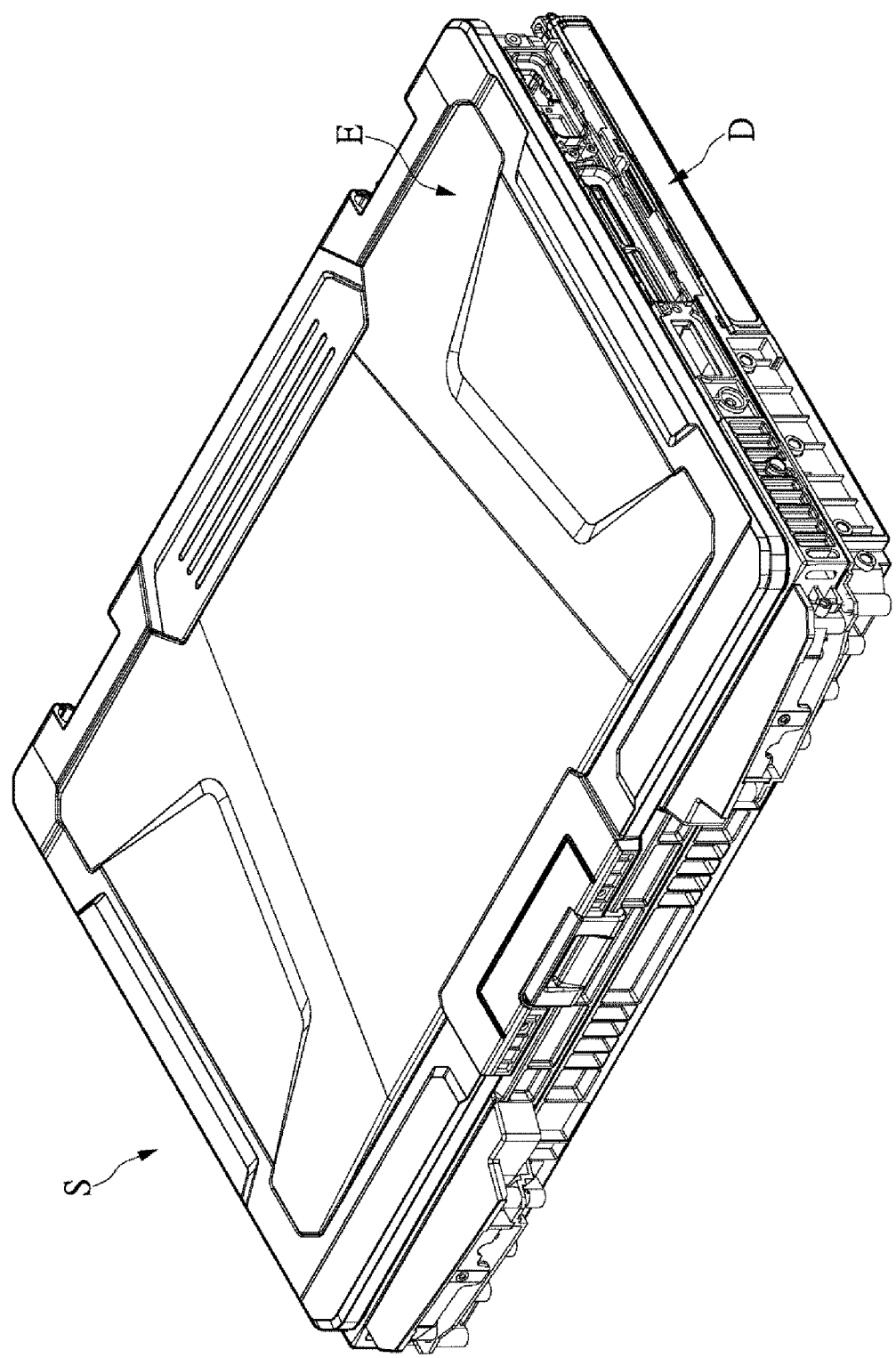
FIG. 1 is a three-dimensional schematic diagram of an electronic system according to a first embodiment of the present invention.

Specific embodiments are given below to describe implementations of "an expansion electronic device and an electronic system" of the present invention, and a person skill in the art can understand the advantages and effects of the present invention on the basis of the disclosure of the detailed description of the present application. The present invention can be implemented or applied by other specific embodiments, and various details in the detailed description can also be modified and changed on the basis of different aspects and applications without departing from the concept of the present invention. In addition, the accompanying drawings of the present invention are simple illustrations and are not drawn to actual scales. Technical contents related to the present invention are given in detail in the embodiments below, and it should be noted that the contents provided are to not be construed as limitations to the scope of protection of the present invention.

It is to be understood that, although the terms such as "first", "second" and "third" are used in the description to describe various elements, these elements are not to be construed as being limited by these terms. These terms are primarily for differentiating one element from another element. Further, the term "or" used in the description may include any one or more combinations of the related listed items according to actual conditions.

First Embodiment

FIG. 1 to FIG. 4 are respectively a three-dimensional schematic diagram of an electronic system, an exploded schematic diagram of an electronic system, a three-dimensional schematic diagram of an expansion electronic device, and an exploded schematic diagram of an expansion electronic device according to a first embodiment of the present invention. As shown, an expansion electronic device D, adapted to be joined with a primary electronic device E and to operate cooperatively, is provided according to the first embodiment of the present invention. The expansion electronic device D may include a housing 1 and a plurality of functional modules 2 and 2a. The housing 1 may have an assembly surface 10 on a top side thereof, and a plurality of individually independent receiving chambers 11 and 11a on a bottom side thereof. The assembly surface 10 is configured to join with the primary electronic device E, and a first waterproof space S1 is formed by means of structural interference between the assembly surface 10 and the primary electronic device E. The plurality of functional modules 2 and 2a are disposed in the receiving chambers 11, respectively, and are individually installed or removed. A second waterproof space S2 is formed by means of structural interference between one of the receiving chambers 11a and the corresponding functional module 2a.

More specifically, the expansion electronic device D of the present invention may be detachably joined with the primary electronic device E and be electrically connected to the primary electronic device E, so as to become a comprehensively functional electronic system with waterproofness. The primary electronic device E may be a laptop computer. The housing 1 has the assembly surface 10 configured to join with the primary electronic device E, and the plurality of receiving chambers 11 and 11a for receiving the plurality of functional modules 2 and 2a. Further, referring to FIG. 4, each of the receiving chambers 11 and 11a on the housing 1 may be configured to receive one of the functional modules 2 and 2a. In this embodiment, the plurality of functional modules 2 and 2a may be, for example but not limited to, a display card module, an optical disk module and at least one battery module, respectively. The functional modules 2 and 2a may each be independently installed in the corresponding receiving chambers 11 and 11a, and also be independently disengaged from the receiving chambers 11 and 11a (or be removed from the receiving chambers 11 and 11a). Thus, when a user needs to replace a functional module for a new one or to perform maintenance of a particular functional module, quick maintenance and quick replacement may be carried out with respect to a specific functional module by removing and installing the specific functional module, without having to remove and separate the entire housing 1 from the primary electronic device E.

Figure 2:
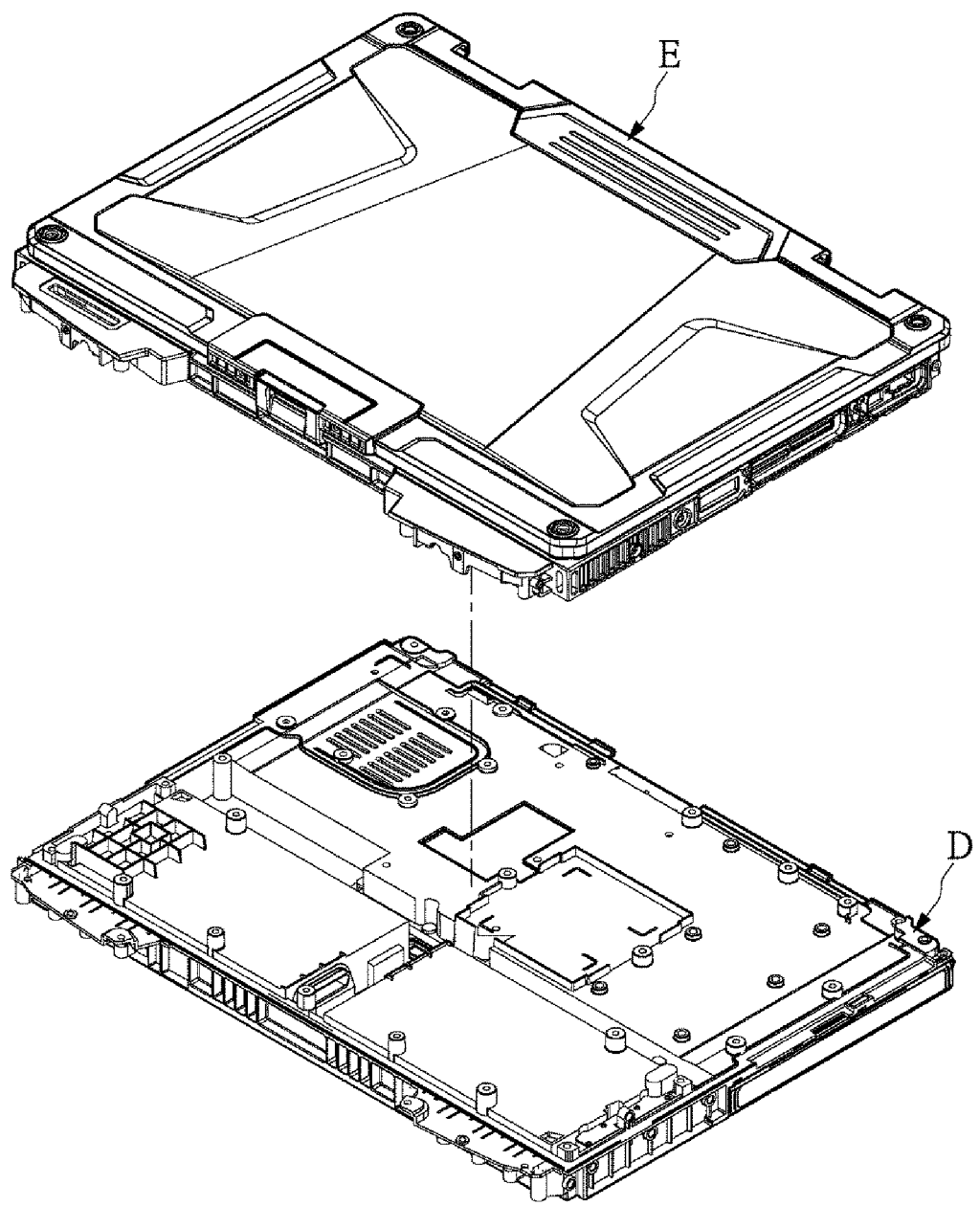
FIG. 2 is an exploded schematic diagram of an electronic system according to the first embodiment of the present invention.
Figure 3:
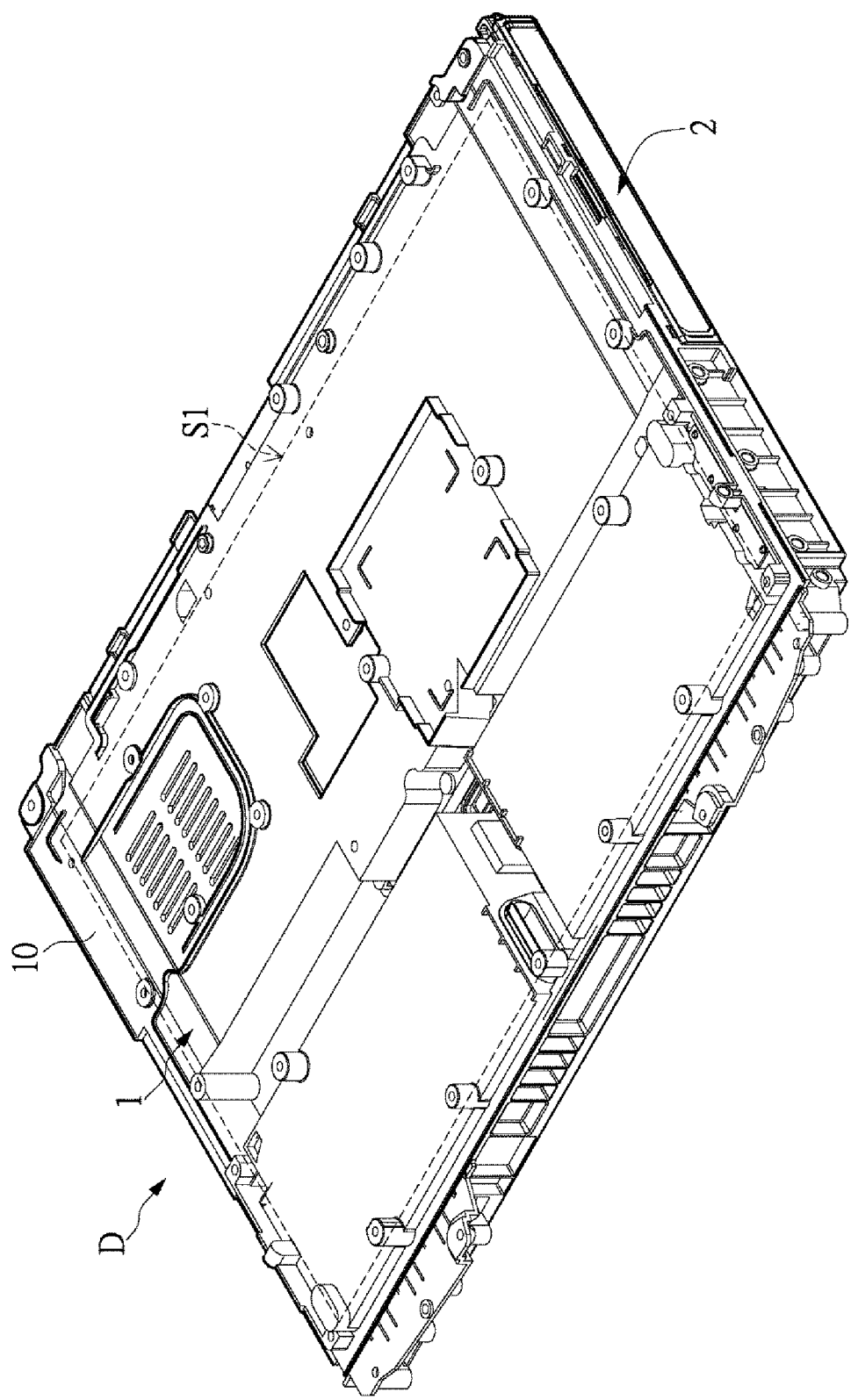
FIG. 3 is a three-dimensional schematic diagram of an expansion electronic device according to the first embodiment of the present invention.

Further, referring to FIG. 2 and FIG. 3, the assembly surface 10 of the housing 1 may be detachably bonded with the bottom of the primary electronic device E, and the first waterproof space S1 may be formed by a space between the assembly surface 10 and the bottom of the primary electronic device E by means of structural interference of the assembly surface 10 and the bottom of the primary electronic device E. Thus, once the expansion electronic device D and the primary electronic device E are bonded, external alien objects (for example, dust or beverage) are incapable of entering the first waterproof space S1 through the seam between the expansion electronic device D and the primary electronic device E.

Figure 4:
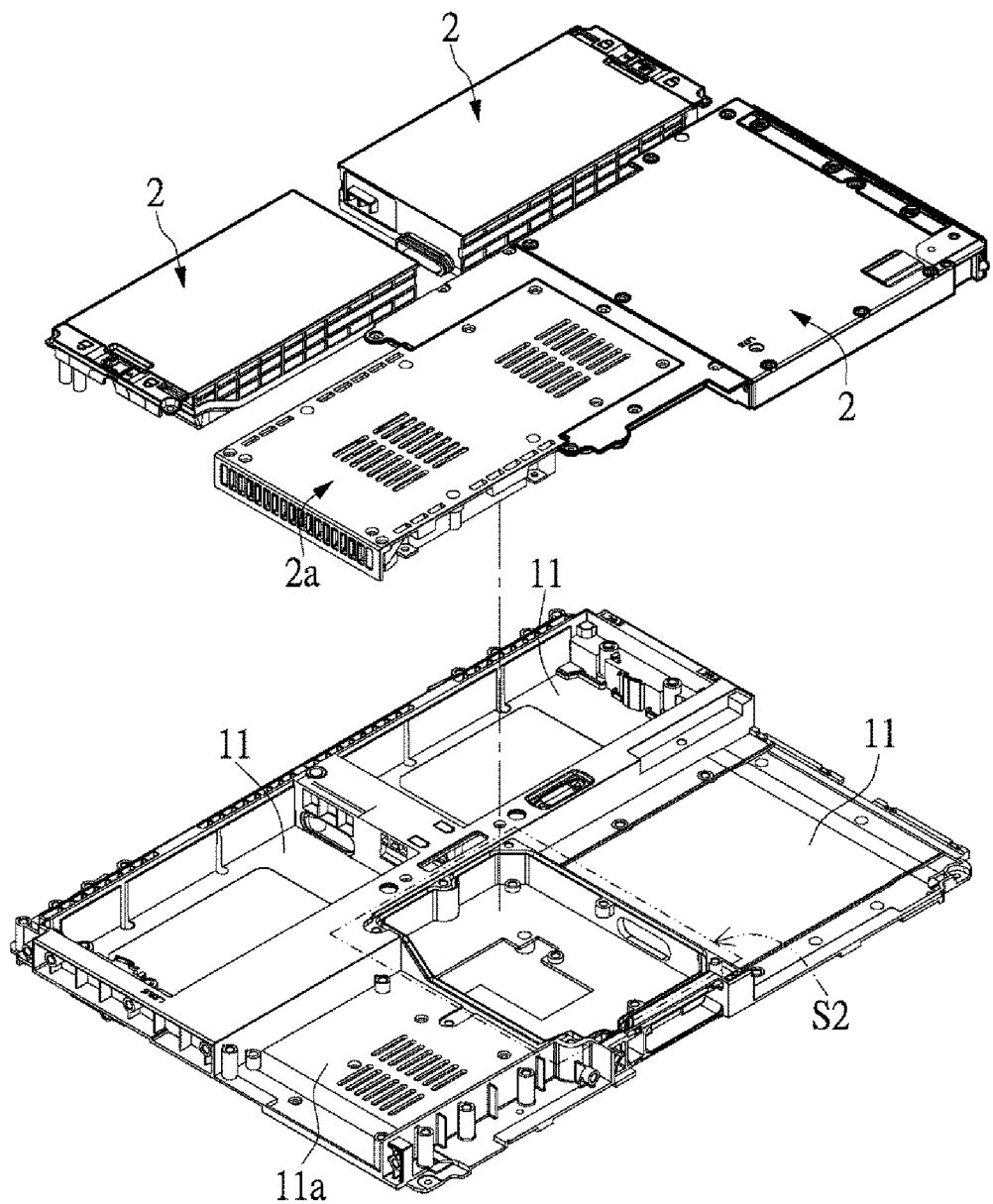
FIG. 4 an exploded schematic diagram of an expansion electronic device according to the first embodiment of the present invention.

Referring to FIG. 4, the expansion electronic device D of the present invention may further have a second waterproof space S2, which is formed by means of the structural interference between one of the functional modules 2a and the corresponding receiving chamber 11a. That is to say, once the functional module 2a is installed in the corresponding receiving chamber 11a, the functional module 2a structurally interferes with the corresponding receiving chamber 11a so as to be isolated from the outside, further preventing external objects (for example, dust or beverage) from entering the second waterproof space S2 through the joint of the functional module 2a and the corresponding receiving chamber 11a during removal/installation of other functional modules 2.

However, the above examples are merely one feasible implementation example and are not to be construed as limitations to the present invention.

Second Embodiment

Figure 5:
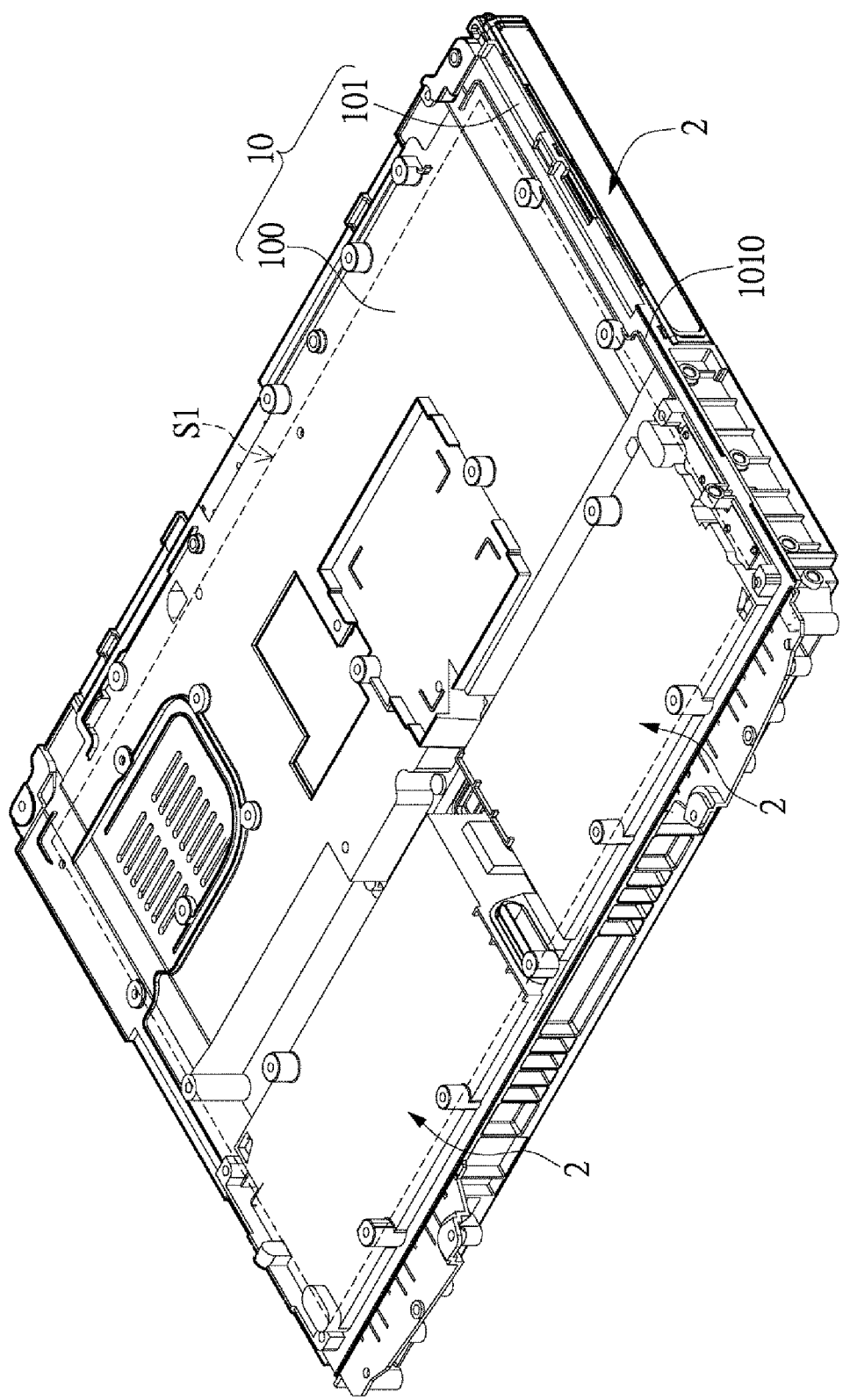
FIG. 5 is a three-dimensional schematic diagram of an expansion electronic device according to a second embodiment of the present invention.
Figure 6:
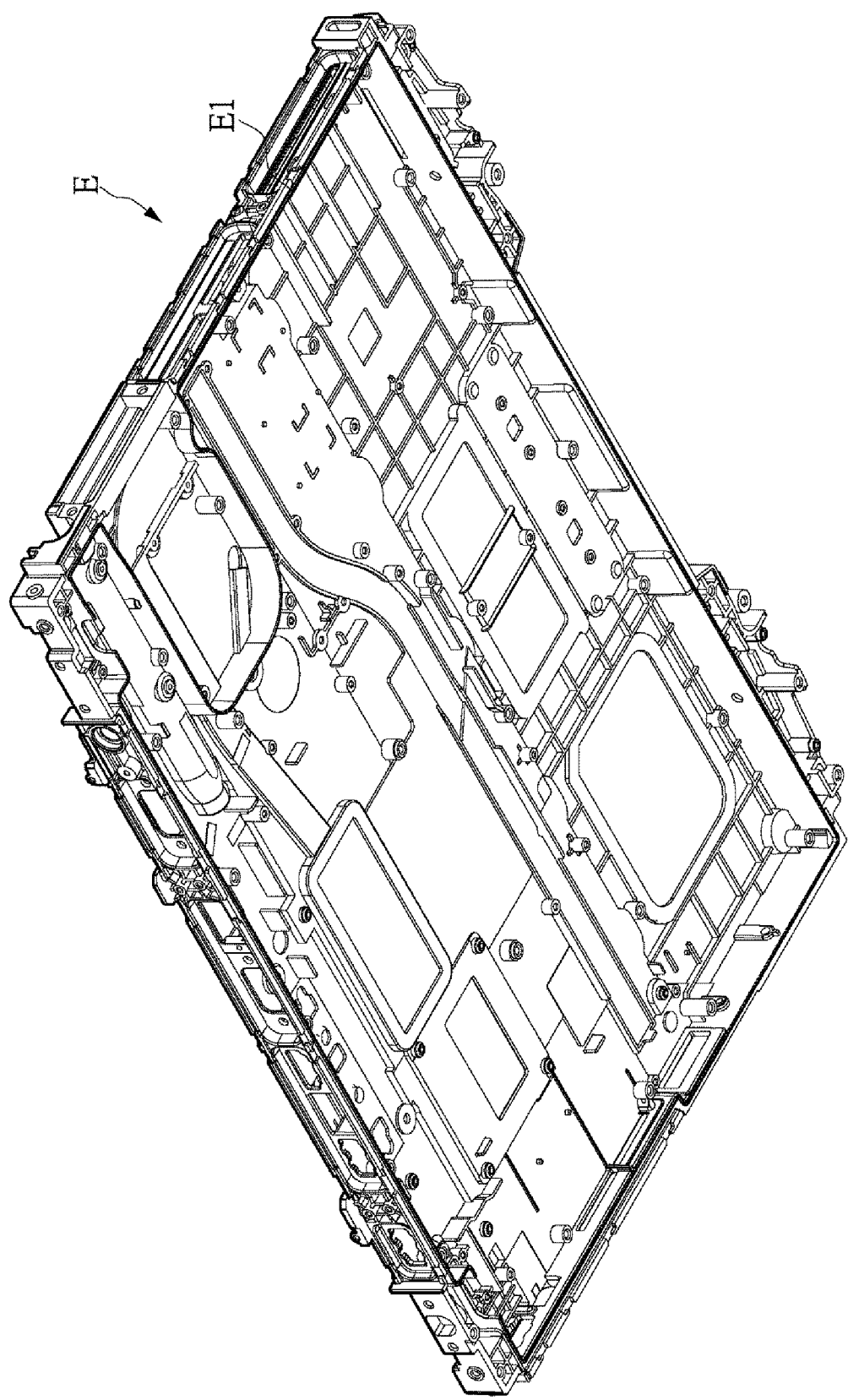
FIG. 6 is a three-dimensional schematic diagram of a primary electronic device according to the second embodiment of the present invention.

FIG. 5 and FIG. 6 show a three-dimensional schematic diagram of an expansion electronic device and a three-dimensional schematic diagram of a primary electronic device according to a second embodiment of the present invention. Also refer to FIG. 1 to FIG. 4. As shown, the expansion electronic device D of this embodiment is substantially similar to the expansion electronic device D of the first embodiment, and repeated details are omitted herein. This embodiment differs from the first embodiment in that, in this embodiment, the assembly surface 10 has a central region 100 corresponding to the first waterproof space S1 and a border region 101 encircling the central region 100, and a first interference structure 1010 is provided in the border region 101; a second interference structure E1 configured to generate sealed interference with the first interference structure 1010 is provided on the bottom of the primary electronic device E. The first interference structure 1010 and the second interference structure E1 are a limiting channel and an elastic sealing member, respectively.

For example, referring to FIG. 5 and FIG. 6, the housing 1 of the present invention seals the space between the assembly surface 10 and the bottom of the primary electronic device E by means of sealed interference of the first interference structure 1010 in the border region 101 and the second interference structure E1 on the bottom of the primary electronic device E, further forming the first waterproof space S1. Meanwhile, the first waterproof space S1 also corresponds to the central region 100 of the assembly surface 10. In this embodiment, the first interference structure 1010 is exemplified by a limiting channel and the second interference structure E1 is exemplified by an elastic sealing member; however, the present invention is not limited to the above examples.

However, the above examples are merely a feasible implementation example and are not to be construed as a limitation to the present invention.

Third Embodiment

Figure 7:
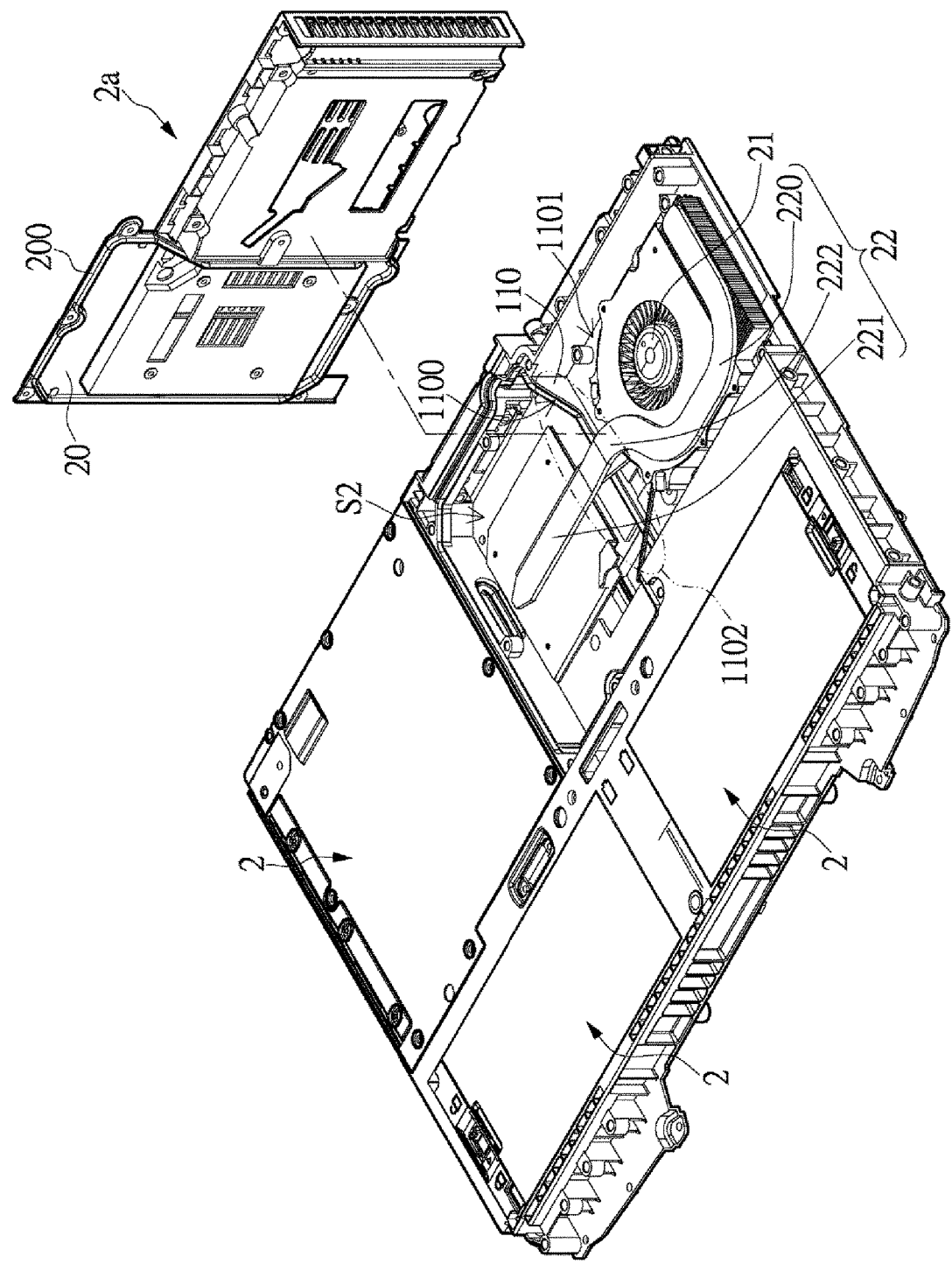
FIG. 7 is an exploded schematic diagram of an expansion electronic device according to a third embodiment of the present invention.

FIG. 7 shows an exploded schematic diagram of an expansion electronic device according to a third embodiment of the present invention. Also refer to FIG. 1 to FIG. 6. As shown, the expansion electronic device D of this embodiment is substantially similar to the expansion electronic device D of the foregoing embodiments, and repeated details are omitted herein. This embodiment differs from the previous embodiments in that, in this embodiment, one of the receiving chambers 11a is provided therein with an enclosed block wall 110 configured to define the second waterproof space S2, and the enclosed block wall 100 has a third interference structure 1100. One of the functional modules 2a may include a base 20, and a fourth interference structure 200 configured to generate sealed interference with the third interference structure 1100 is provided on the bottom of the base 20. The third interference structure 1100 and the fourth interference structure 200 are a limiting channel and an elastic sealing member, respectively.

For example, referring to FIG. 7, the housing 1 may have the enclosed block wall 110 on the other surface opposite to the assembly surface 10, the receiving chamber 11a is defined by the enclosed block wall 110, and the enclosed block wall 110 may further partition a portion of the receiving chamber 11a into the second waterproof space S2. Thus, the expansion electronic device D of the present invention encircles the space of a portion of the receiving chamber 11a by the enclosed block wall 110 by means of sealed interference between the third interference structure 1100 of the enclosed block wall 110 and the fourth interference structure 200 of the base 20, further forming the second waterproof space S2. In this embodiment, the third interference structure 1100 is exemplified by a limiting channel and the fourth interference structure 200 is exemplified by an elastic sealing member; however, the present invention is not limited to the above examples.

Moreover, a heat dissipation space 1101 is further defined in one receiving chamber 11a, one of the functional modules 2a may further include a cooling fan 21, and the cooling fan 21 is disposed in the heat dissipation space 1101. The enclosed block wall 110 has a heat dissipation passage 1102 located between the heat dissipation space 1101 and the second waterproof space S2, one of the functional modules 2a may further include a heat conduction member 22, and the heat conduction member 22 extends from the heat dissipation space 1101 via the heat dissipation passage 1102 to the second waterproof space S2.

For example, referring to FIG. 7, the enclosed block wall 110 on the housing 1 may further partition another portion of the receiving chamber 11a into the heat dissipation space 1101, and the portion of enclosed block wall 110 separating the second waterproof space S2 and the heat dissipation space 1101 may recess toward the assembly surface 10 so as to form the heat dissipation passage 1102. Thus, a heat dissipation portion 220 of the heat conduction member 22 may be connected to the cooling fan 21 and be located within the same heat dissipation space 1101 as the cooling fan 21. Moreover, a heat absorption portion 221 of the heat conduction member 22 may be located in the second waterproof space S2, and a conduction portion 222 of the heat conduction member 22 is connected to the heat absorption portion 221 and the heat dissipation portion 220 via the heat dissipation passage 1102.

However, the above examples are merely one feasible implementation example and are not to be construed as limitations to the present invention.

Fourth Embodiment

Figure 8:
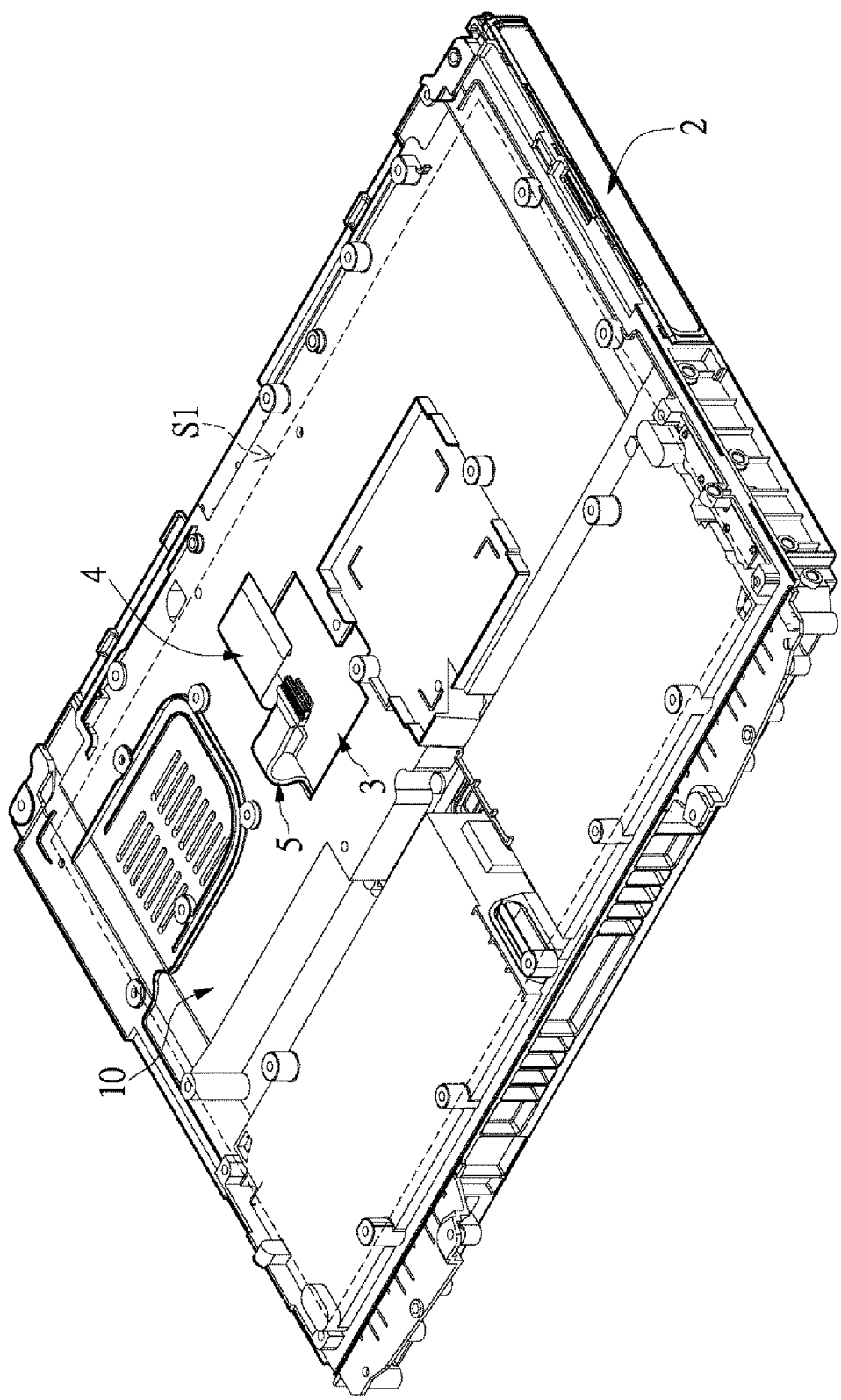
FIG. 8 is a three-dimensional schematic diagram of an expansion electronic device according to a fourth embodiment of the present invention from a first viewing angle.
Figure 9:
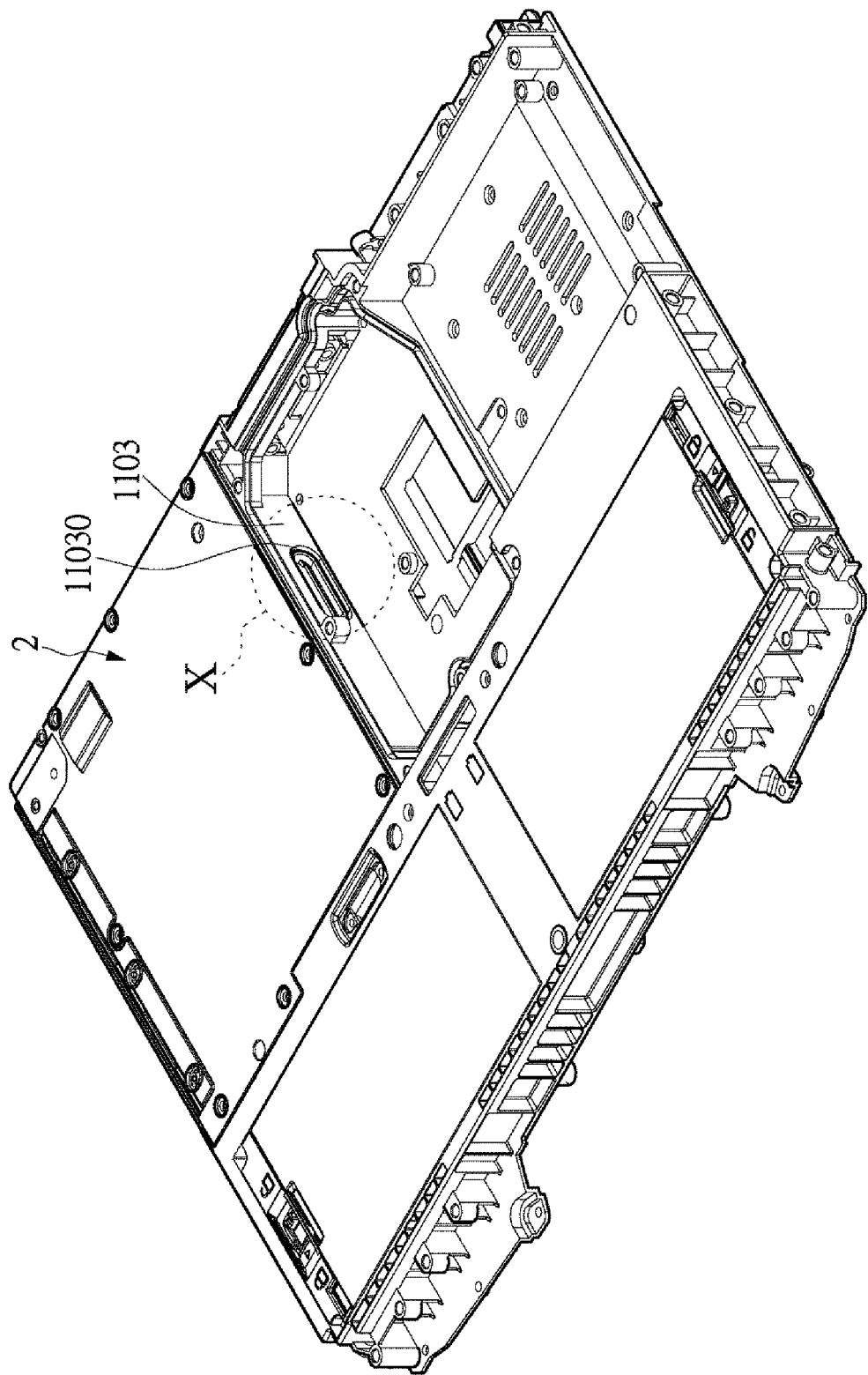
FIG. 9 is a three-dimensional schematic diagram of an expansion electronic device according to the fourth embodiment of the present invention from a second viewing angle.
Figure 10:
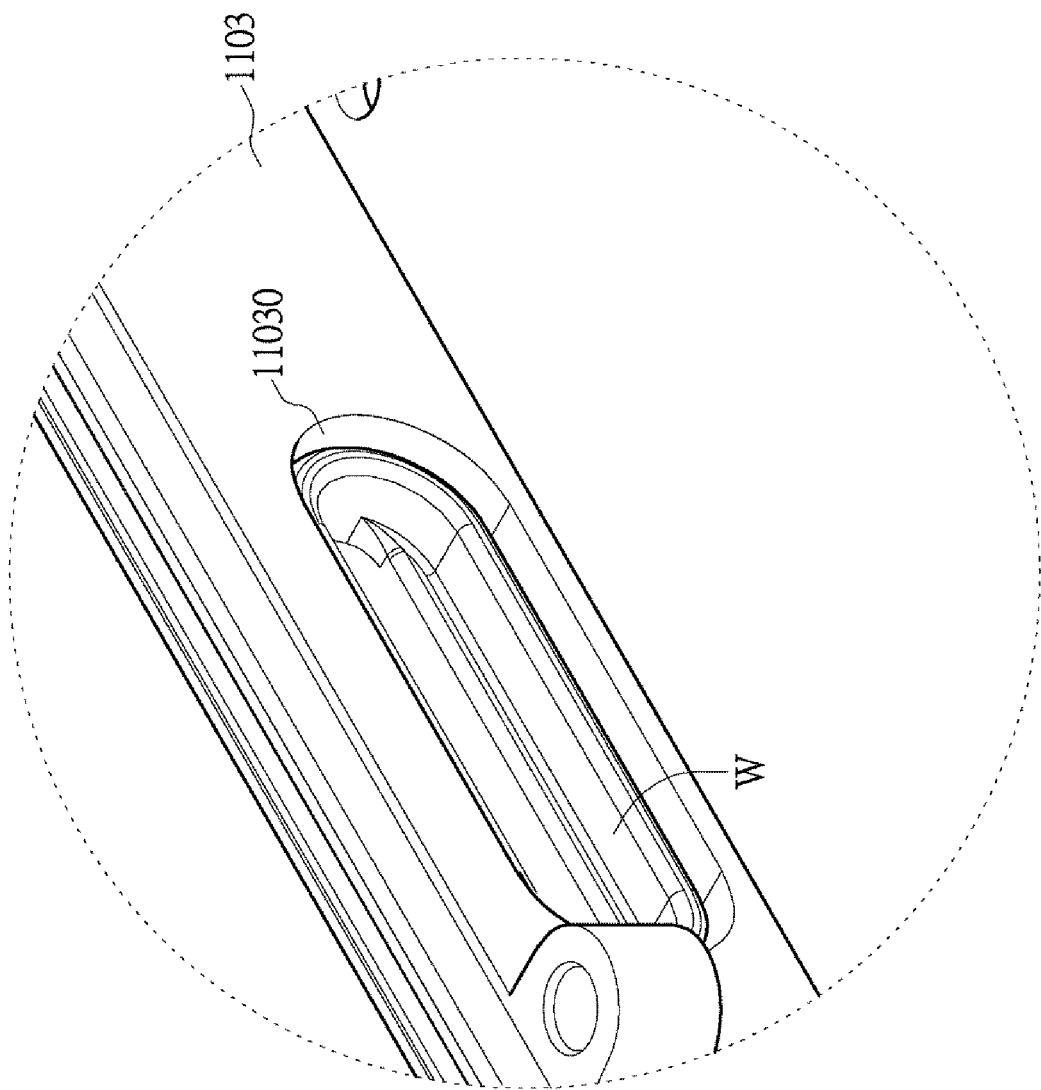
FIG. 10 is an enlarged schematic diagram of part X in FIG. 9.
Figure 11:
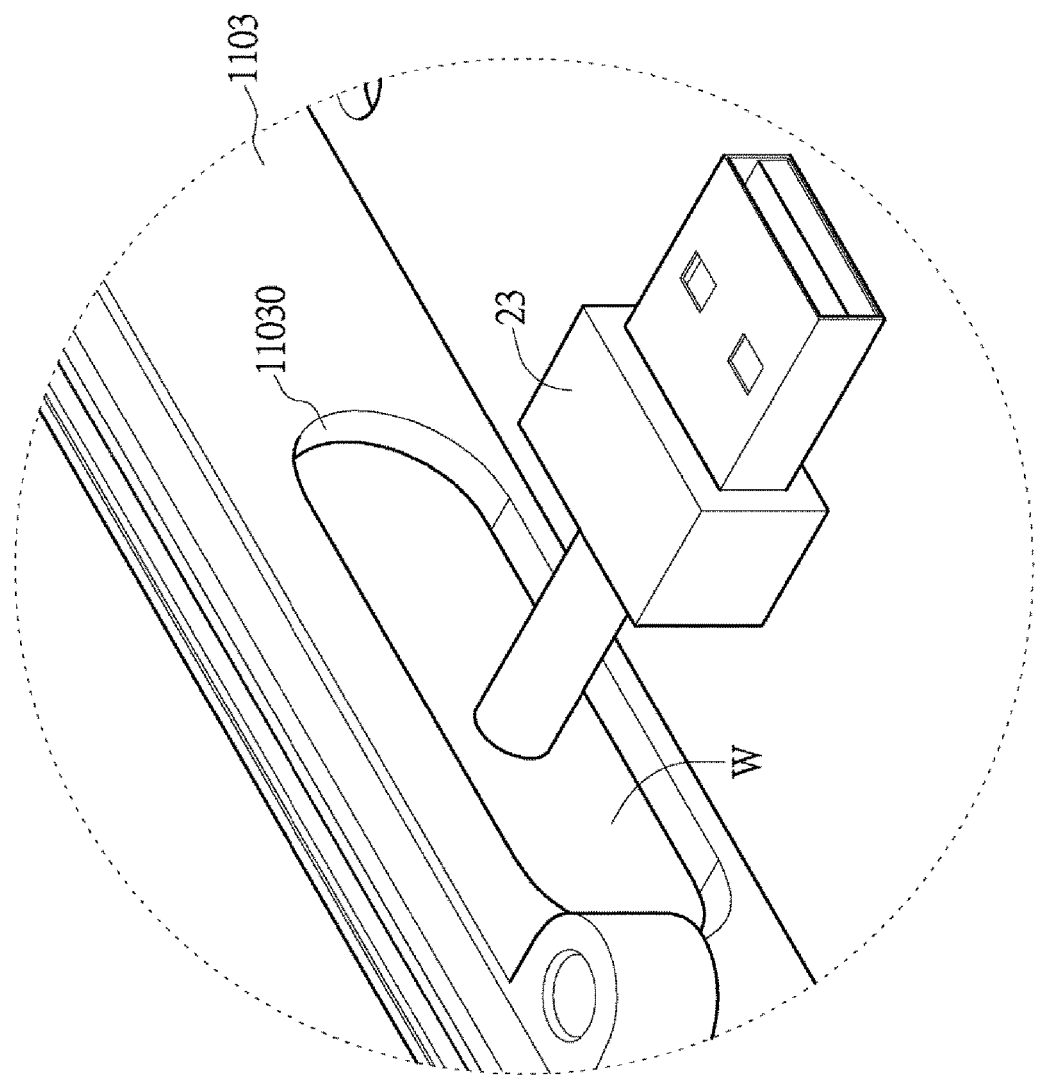
FIG. 11 is a schematic diagram of a state of use of a connection port of a functional module according to the fourth embodiment of the present invention.

FIG. 8 to FIG. 11 show a three-dimensional schematic diagram of an expansion electronic device from a first viewing angle, a three-dimensional schematic diagram of an expansion electronic device from a second viewing angle, an enlarge schematic diagram of part X in FIG. 8 and a schematic diagram of a state of use of a connection port of a functional module according to a fourth embodiment of the present invention. Also refer to FIG. 1 to FIG. 10. The expansion electronic device D of this embodiment is substantially similar to the expansion electronic device D of the foregoing embodiments, and repeated details are omitted herein. This embodiment differs from the foregoing embodiments in that, in this embodiment, the expansion electronic device D may further include a circuit board 3, which is disposed in the second waterproof space S2 and is electrically connected to the plurality of functional modules 2. The expansion electronic device D may further include an FPC connector and a cable connector 5 configured to be electrically connected to the primary electronic device E.

For example, referring to FIG. 8, the circuit board 3 may be disposed in the second waterproof space S2, and the circuit board 3 may be electrically connected to the primary electronic device E by the FPC connector 4 and the cable connector 5; that is to say, one end of the FPC connector 4 and one end of the cable connector 5 may be electrically connected to the circuit board 3, and the other end of the FPC connector 4 and the other end of the cable connector 5 may be electrically connected to the primary electronic device E.

Further, the enclosed block wall 110 may have a sidewall 1103, which may have a through hole 11030 in communication with the second waterproof space S2; another functional module 2 is disposed in another receiving chamber 11 partitioned by the sidewall 1103, and may have a connection port 23 that is located in the through hole 11030 so as to be electrically connected to the circuit board, wherein sealed interference is generated by the connection port 23 and the through hole 11030. A waterproof washer W may be present between the connection port 23 and the through hole 11030.

For example, referring to FIG. 8 to FIG. 11, a portion of the enclosed block wall 110 of the present invention may be the sidewall 1103, which may be configured to separate two adjacent receiving chambers 11 and 11a and may have the through hole 11030 in communication with the two adjacent receiving chambers 11 and 11a; that is to say, the through hole 11030 can communicate the receiving chamber 11 and the second waterproof space S2. Moreover, the functional module 2 located in the receiving chamber 11 is electrically connected to the circuit board 3 by means of passing through the connection port 23 in the through hole 11030 and electrically connecting the connection port 23 to the circuit board 3. Further, in order to prevent alien objects from entering the second waterproof space S2 via the through hole 11030 during replacement of the functional module 2, the expansion electronic device D of the present invention is provided with the waterproof washer W in the through hole 11030. Thus, in the expansion electronic device D of the present invention, space communication between the receiving chamber 11 and the second waterproof space S2 is blocked by providing the waterproof washer W in the through hole 11030 and pressing or contacting the waterproof washer W against an inner wall of the through hole 11030 corresponding to the connection port 23 and the sidewall 1103.

However, the above examples are merely one feasible implementation example and are not to be construed as limitations to the present invention.

It should be noted that, an electronic system S is further provided by the present invention on the basis of the above contents. The electronic system S includes a primary electronic device E and the expansion electronic device D according to the any one of the described embodiments, wherein the expansion electronic device D and the primary electronic device E are joined into an integral and operate cooperatively.

Beneficial Effects of the Embodiments

One beneficial effect of the present invention is that, the expansion electronic device D and the electronic system S provided by the present invention are capable of enhancing functionality of laptop computers as well as improving waterproofness and dustproofness by the technical solution that is "the expansion electronic device D may include a housing 1 and a plurality of functional modules 2 and 2a, the housing 1 may have an assembly surface 10 on a top side thereof and a plurality of individually independent receiving chambers 11 and 11a on a bottom side thereof, the assembly surface 10 is configured to join with a primary electronic device E, a first waterproof space S1 is formed by means of structural interference between the assembly surface 10 and the primary electronic device E, the plurality of functional modules 2 and 2a are disposed in the plurality of receiving chambers 11 and 11a, respectively, and are installed or removed individually, and a second waterproof space S2 is formed by means of structural interference between one of the receiving chambers 11a and the corresponding functional module 2a".

Further, by means of forming a plurality of individually independent receiving chambers 11 and 11a on the housing 1, a plurality of functional modules 2 and 2a are provided in the expansion electronic device D and the electronic system S of the present invention, and the functional modules 2 and 2a may be independently installed on the housing 1 or be independently directly removed and separated from the housing 1. Thus, to remove/install a specific functional module, it is not necessary to remove and separate the entire housing 1 from the primary electronic device E, further enhancing functionality of the primary electronic device E. Moreover, the expansion electronic device D and the electronic system S of the present invention are capable of preventing external alien objects (for example, dust or beverage) from entering the expansion electronic device D and the receiving chamber 11a by the first waterproof space S1 formed by means of structural interference between the assembly surface 10 of the housing 1 and the bottom of the primary electronic device E, and the second waterproof space S2 formed by means of structural interference between one of the functional modules 2a and the corresponding receiving chamber 11a, further improving waterproofness and dustproofness of the primary electronic device E.

The described contents are merely preferred feasible embodiments of the present invention, and are not to be construed as limitations to the present invention. Equivalent technical changes made on the basis of the contents of detailed description of the application and the drawings are to be encompassed within the appended claims of the present invention.

What is claimed is:

1. An expansion electronic device, adapted to be joined with a primary electronic device and to operate cooperatively, the expansion electronic device comprising:

a housing, having an assembly surface on a top side thereof and a plurality of individually independent receiving chambers on a bottom side thereof, wherein the assembly surface is configured to join with the primary electronic device, and a first waterproof space is formed by means of structural interference between the assembly surface and the primary electronic device; and a plurality of functional modules, respectively disposed in the receiving chambers, being individually installed or removed, wherein a second waterproof space is formed by means of structural interference between one of the receiving chambers and the corresponding functional module;

wherein one of the receiving chambers is provided therein with an enclosed block wall configured to define the second waterproof space, and the enclosed block wall has a third interference structure; one of the functional modules comprises a base, and a fourth interference structure configured to generate sealed interference with the third interference structure is provided on a bottom of the base; and wherein the enclosed block wall further defines a heat dissipation space in one of the receiving chambers, and one of the functional modules further comprises a cooling fan that is disposed in the heat dissipation space.

2. The expansion electronic device according to claim 1, wherein the enclosed block wall has a heat dissipation passage located between the heat dissipation space and the second waterproof space, and one of the functional modules further comprises a heat conduction member that extends from the heat dissipation space via the heat dissipation passage to the second waterproof space.

3. An expansion electronic device, adapted to be joined with a primary electronic device and to operate cooperatively, the expansion electronic device comprising:

a housing, having an assembly surface on a top side thereof and a plurality of individually independent receiving chambers on a bottom side thereof, wherein the assembly surface is configured to join with the primary electronic device, and a first waterproof space is formed by means of structural interference between the assembly surface and the primary electronic device; and a plurality of functional modules, respectively disposed in the receiving chambers, being individually installed or removed, wherein a second waterproof space is formed by means of structural interference between one of the receiving chambers and the corresponding functional module;

a circuit board, disposed in the second waterproof space and electrically connected to the plurality of functional modules;

wherein one of the receiving chambers is provided therein with an enclosed block wall configured to define the second waterproof space, and the enclosed block wall has a third interference structure; one of the functional modules comprises a base, and a fourth interference structure configured to generate sealed interference with the third interference structure is provided on a bottom of the base; and wherein the enclosed block wall has a sidewall that has a through hole in communication with the second waterproof space; another of the functional modules is disposed in another of the receiving chambers partitioned by the sidewall, the another of the functional modules has a connection port, the connection port is located in the through hole so as to be electrically connected to the circuit board, and the connection port and the through hole generate sealed interference.

4. The expansion electronic device according to claim 3, further comprising a waterproof washer is present between the connection port and the through hole.

* * * * *